United States Patent [19]

Ichiyoshi

[11] Patent Number: 5,357,447
[45] Date of Patent: Oct. 18, 1994

[54] RATE CONVERSION APPARATUS

[75] Inventor: Osamu Ichiyoshi, Tokyo, Japan

[73] Assignee: NEC Corporation, Japan

[21] Appl. No.: 771,727

[22] Filed: Oct. 4, 1991

[30] Foreign Application Priority Data

Oct. 5, 1990 [JP] Japan .................. 2-266608

[51] Int. Cl.⁵ .................. G06F 7/68; G06F 1/04
[52] U.S. Cl. .................. 364/484; 364/701; 328/15
[58] Field of Search .......... 364/724.1, 484, 701; 363/157; 375/111; 328/15, 11

[56] References Cited

U.S. PATENT DOCUMENTS

| | | | |
|---|---|---|---|
| 3,851,251 | 11/1974 | Wigner et al. | 325/55 |
| 4,234,929 | 11/1980 | Riley, Jr. | 328/15 |
| 4,310,800 | 1/1982 | Baker et al. | 364/484 |
| 4,360,788 | 11/1982 | Erps et al. | 331/1 A |
| 4,672,299 | 6/1987 | Grimes et al. | 364/484 |
| 4,715,000 | 12/1987 | Premerlani | 364/484 |
| 4,839,603 | 6/1989 | Mower et al. | 328/14 |
| 4,954,961 | 9/1990 | Fontanes | 364/484 |
| 4,983,906 | 1/1991 | Hiller | 364/484 |
| 5,019,785 | 5/1991 | Fognini et al. | 328/14 |
| 5,063,354 | 11/1991 | Kauper et al. | 364/484 |

Primary Examiner—Thomas G. Black
Assistant Examiner—Tyrone V. Walker
Attorney, Agent, or Firm—Laff, Whitesel, Conte & Saret

[57] ABSTRACT

A first clock signal of f1 in frequency is converted into a second clock signal having a frequency of $f2=(n/m)f1$. The first clock signal is converted by a tank circuit (12) and a converter (13) into an R-bit first phase signal ($\theta 1$) indicating the phase of the first clock signal. The first phase signal is multiplied by n (mod $2^R$) by a multiplier to provide a second phase signal ($\theta 3$). The second phase signal is supplied to a digital phase-locked loop (PLL) (3) comprising a subtractor (15), a low-pass filter (LPF) (16), a numerically controlled oscillator (NCO) (17) and a multiplier (18). The multiplier in the digital PLL (3) multiplies a third phase signal by m (mod $2^R$), indicating the phase of a second clock signal which is the output of the NCO (17), to generate a fourth phase signal. The subtractor (15) generates a signal representing the phase error between the second and fourth phase signals. This phase error signal is filtered by the LPF (16) to control the oscillating phase of the NCO (17). A clock generating circuit generates the second clock signal, on the basis of the third phase signal.

14 Claims, 3 Drawing Sheets

RATE CONVERSION APPARATUS

BACKGROUND OF THE INVENTION

The present invention relates to a technique for converting a data sequence of a transmission rate f1 to another data sequence of another transmission rate f2, and more particularly to a rate conversion apparatus for generating from clock signals of a frequency f1 to clock signals of another frequency f2.

The signal transmission rate is often converted in communication systems, and conversion is frequently accomplished from a signal transmission rate of f1 (samples/sec) into another transmission rate f2 which is equal to n/m times (m and n are mutually prime natural numbers) f1.

In one of the cases well known to persons skilled in the art where such processing takes place, data received over a line having a transmission rate f1 are sent out over another line having a transmission rate f2, which is not equal to f1. In another instance, data of an f1 transmission rate are subjected to error detection coding or error correcting coding to be converted into data of f2 in transmission rate (f1<f2 in this case).

What is needed here is a generation of other clock signals of another frequency f2 from a clock signal of a frequency f1. For this purpose, a frequency synthesizer using a phase-locked loop (PLL) is often used. For details on such a frequency synthesizer using a PLL, reference may be made to F. M. Gardner, Phaselock Techniques (1979, John Willey & Sons, Inc.), pp. 208–214.

In the presence of a relationship of nf1=mf2 (where m and n are mutually prime integers) between the frequencies f1 and f2, this frequency synthesizer is composed of an m frequency divider for frequency-dividing signals of the frequency f1 by m and a PLL to which the output of the m frequency divider is supplied. The PLL further consists of a phase comparator having a first input terminals which is supplied with the output of the m frequency divider, a loop filter for filtering the output of the phase comparator, a voltage-controlled oscillator (VCO) having an oscillation frequency which varies around a center frequency of f2 according to the output of the loop filter, and the n frequency divider for frequency-dividing the output of the VCO by n and supplying the n frequency-divided output to a second terminal of the phase comparator. According to the prior art, clock signals of the frequency f1 are converted into clock signals of the frequency f2 in this manner. In this case, the frequency $\Delta f$ of the signals entered into the two inputs of the phase comparator is equal to f1/m=f2/n. This method will be hereinafter referred to as the first method.

Incidentally, m and n sometimes may be very large numbers. If, for instance, f1 is 1.544 MHz and f2, 2.048 MHz, m will be 193 and n, 256, and in this case the frequency $\alpha f$ of the input signals of the phase comparator in the PLL would be equal to f1/m=f2/n=8 kHz. The bandwidth of the loop filter should be sufficiently narrower than 8 kHz, for example, around 1 kHz. The pull-in time of the PLL in this instance will be about 1 msec, which is an undesirably long pull-in time.

A conceivable solution to this problem, according to the prior art, is to replace the n frequency divider with an m times multiplier and the m frequency divider in the PLL with an n times multiplier. In this way, the frequency f0 of the two signals may be compared by the phase comparator equal to nf1=mf2. By this method (which will be hereinafter referred to as the second method), the input frequency f0 of the phase comparator is higher than f1 and f2, so that the bandwidth of the loop filter can be broadened and the pull-in time reduced. This method, however, entails a very high input frequency f0=nf1=mf2=395.264 MHz for the phase comparator, and the circuitry would be difficult to realize.

SUMMARY OF THE INVENTION

An object of the present invention is to provide a rate conversion apparatus which may take short pull-in time irrespective of the n/m ratio between a first frequency f1 and a second frequency f2 and may permit a ready realization of appropriate circuitry.

According to the invention, there is provided a rate conversion apparatus for converting a first periodical signal of frequency f1 into a second periodical signal of f2=(n/m) f1 (where m and n are mutually prime integers), said apparatus comprising:

clock generating means for generating an operation clock having a frequency fs which is higher than said f1 or f2, which ever is the higher;

phase extracting means for converting, on the basis of said operation clock, said first periodical signal into an R-bit first phase signal indicating the phase of the first periodical signal;

first multiplying means for generating a second phase signal by multiplying said first phase signal by n (modulo $2^R$);

subtracting means for generating a phase error signal by subtracting a fourth phase signal from said second phase signal;

periodical signal generating means for generating, on the basis of said operating clock and said phase error signal, a third phase signal indicating the phase of said second periodical signal;

means for generating said fourth phase signal by multiplying said third phase signal by m (modulo $2^R$); and means for generating said second periodical signal on the basis of said third phase signal.

DETAILED DESCRIPTION OF THE PREFERRED EMBODIMENTS

Figure 1:
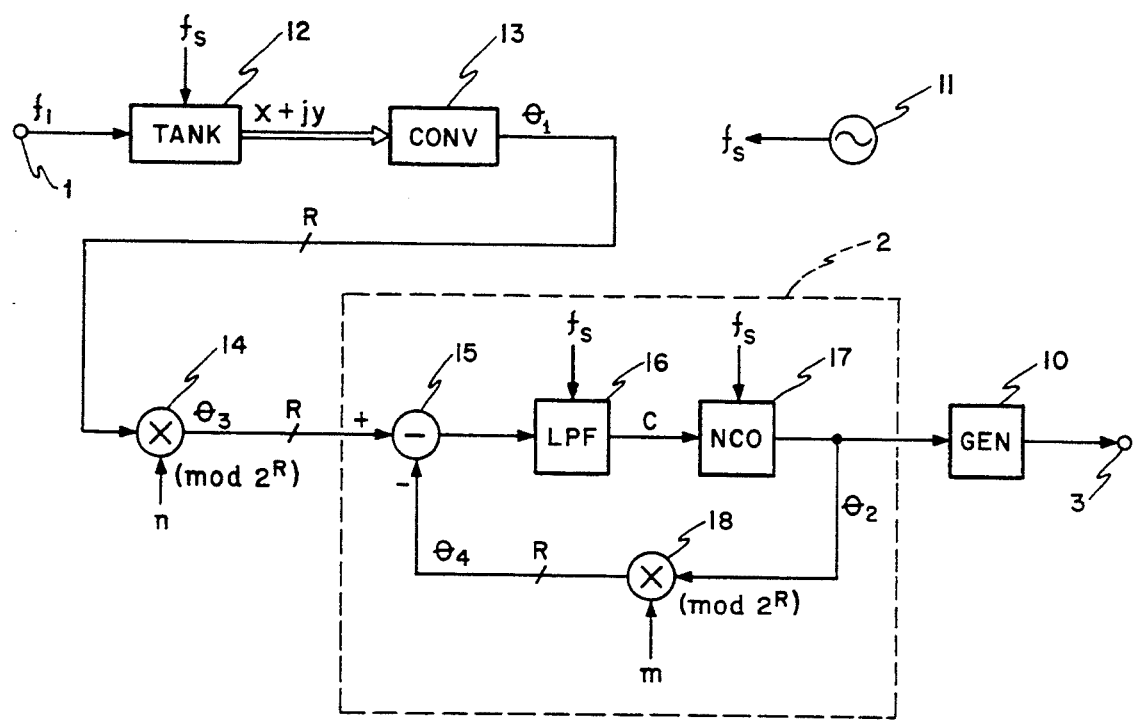
FIG. 1 is a block diagram illustrating a rate conversion apparatus, which is a first preferred embodiment of the present invention.

FIG. 1 is a block diagram illustrating a first preferred embodiment of the invention. This embodiment involves a digital tank circuit 12 which receives a first clock signal of f1 in frequency and supplies a complex signal, a read-only memory (ROM) 13 for converting the complex signal into an R-bit signal $\theta 1$ indicating the phase of the first clock signal, and a multiplier 14 for multiplying the phase signal $\theta 1$ by n (modulo $2^R$). This embodiment is also provided with a digital phase lock loop (PLL) 2 comprising a subtractor 15, a digital low-pass filter (LPF) 16, a numerically controlled oscillator (NCO) 17, and a multiplier 18 for multiplying the output of the NCO 17 by m (modulo $2^R$). The NCO 17 supplies another phase signal $\theta 2$ indicating the phase of a second clock signal of f2 in frequency. The embodiment further involves a clock source 11 for supplying an operation clock signal of fs in frequency to the digital tank circuit 12, the LPF 16 and the NCO 17, and a clock generating circuit 10 for converting the signal $\theta 2$, which is supplied by the NCO 17, into the second clock signal. The frequency fs of the operation clock is determined by the level of accuracy required for the waveform of the second clock signal. About 32 times the frequency f1 or f2, whichever is higher, is usually sufficient as fs.

Next will be described the operation of the preferred embodiment shown in FIG. 1. The first clock signal of f1 in frequency is supplied to the digital tank circuit 12, which extracts, on the basis of the operation clock from a clock generator, only the frequency f1 component from the first clock signal. At the same time, it converts the first clock signal into the complex signal $x+jy$ whose phase angle indicates the phase of the first clock signal.

The configuration of this digital tank circuit 12 will be described later in further detail. This complex signal is further converted by a converting circuit or the read only memory 13 into the first phase signal $\theta 1$, i.e. a signal indicating the phase of the first clock signal. This converting circuit 13 can be composed of a read-only memory (ROM), having the real and imaginary parts of the complex signal as addresses and a phase angle stored in each address. This first phase signal $\theta 1$ is represented by an R-bit digital signal. The first clock signal entered from a terminal 1 is thus converted into the first phase signal $\theta 1$ indicating the phase of the first clock signal.

This first phase signal $\theta 1$ is n-multiplied by the mudulo $2^R$ multiplier 14 into $n\theta 1$ (mod $2^R$). Thus the multiplier 14 supplies a third phase signal $\theta 3$ (R-bit) indicating the phase of a cyclic signal of nf1 in frequency, resulting from the n-multiplication of the first clock signal of f1 in frequency, to the digital PLL 2.

From the third phase signal $\theta 3$ is subtracted a fourth phase signal $\theta 4$ by the subtractor 15 to give a phase error signal. This phase error signal is smoothed by the LPF 16 into a smoothed phase error signal C. The NCO 17 supplies the phase signal $\theta 2$ to control the frequency and phase of the second clock signal, which is supplied from a clock pulse generating circuit 10, on the basis of the smoothed phase error signal C and the operation clock. This phase signal $\theta 2$ thus represents the phase of the second clock signal. The configuration of the NCO 17 will be described later in further detail.

The clock generating circuit 10 receives the phase signal $\theta 2$ and supplies the second clock signal of f2 in frequency. This clock generating circuit 10 can be composed of a read-only memory in which amplitude values are stored correspondingly to phase signals. If a rectangular wave is required as the second clock signal, the most significant bit of the R-bit phase signal $\theta 2$ may as well be extracted and used as the second clock signal.

The phase signal $\theta 2$ is also supplied to the multiplier 18, which multiplies this phase signal $\theta 2$ by m (modulo $2^R$) into the fourth phase signal $\theta 4$. This fourth phase signal $\theta 4$ represents the phase of the periodic signal of mf2 in frequency, which is obtained by multiplying the second clock signal of f2 in frequency by m. The fourth phase signal $\theta 4$ is subtracted from the third phase signal $\theta 3$ by the subtractor 15 to give a phase error signal ($\theta 3-\theta 4$), which, as mentioned above, is supplied to the LPF 16.

In this way, the phase signal $\theta 4$ is phase-synchronized with the phase signal $\theta 3$. This is equivalent to the phase-synchronism between the periodical signal of nf1 in frequency corresponding to the phase signal $\theta 3$ and the periodical signal of mf2 in frequency corresponding to the phase signal $\theta 4$. Therefore, the function of this preferred embodiment is equivalent to the second method described in the BACKGROUND OF THE INVENTION section.

What is to be noted here is that the operation of the preferred embodiment illustrated in FIG. 1 takes place wholly at the timings set by the operation clock frequency fs. As already stated, the frequency fs of this operation clock will be high enough if it is about 32 times the frequency f1 or f2, whichever is higher. In the aforementioned case wherein f1 is 1.544 MHz and f2 is 2.048 MHz, fs may be about 65 MHz.

The invention is free from the disadvantage of the second method described in the BACKGROUND OF THE INVENTION section, where the input frequency of the phase comparator becomes too high for ready production of the PLL. Moreover, since the operation rate of the digital PLL is relatively high, about 65 MHz, the bandwidth of the PLL, even if it is selected at $\frac{1}{8}$ of fs, will be about 8 MHz. Therefore the pull-in action of the PLL will be quick enough to overcome the disadvantage of the aforementioned first method.

Figure 2:
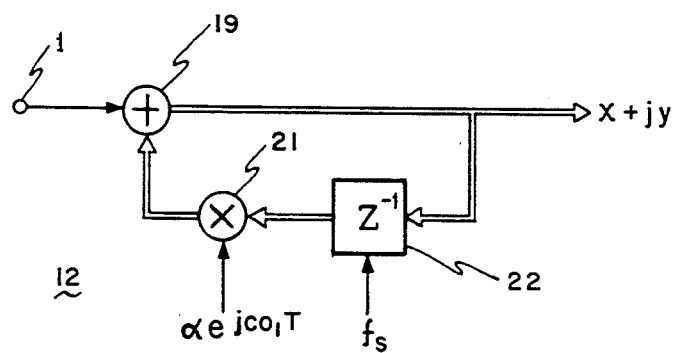
FIG. 2 is a block diagram of one example of the digital tank circuit shown in FIG. 1.

Next will be described the configuration and operation of the digital tank circuit 12 with reference to FIG. 2. The digital tank circuit 12 is provided with an adder 19, a one-sample delay circuit ($Z^{-1}$) 20 and a multiplier 21. The one-sample delay circuit is supplied with the operation clock signal (fs). To the multiplier 21 is supplied $\alpha \exp(j\omega 1 T)$ in accordance with the input signal (f1), where $\alpha$ is a constant and $\omega 1 = 2\pi f1$ and $T=1/fs$ (sampling period).

Therefore the transfer function T(Z) of the digital tank circuit 12 can be represented by the following equation.

$$T(Z) = 1/\{1 - \alpha\exp(j\omega 1 T) Z^{-1}\} \quad (1)$$
$$= 1/[1 - \alpha\exp\{-j(\omega - \omega 1)T\}]$$

where $Z = \exp(j\omega T)$ and $\omega = 2\pi f$.

It is seen that, as a result, the digital tank circuit 12 is tuned to the frequency f1 and operates as a single-tuned circuit of $\pm(1-\alpha)fs/2\pi$ Hz in bandwidth.

The digital tank circuit 12 is also a complex signal processing circuit, and the complex signal $x+jy$, which is its output, is a signal whose phase angle indicates the phase of the first clock signal.

Figure 3:
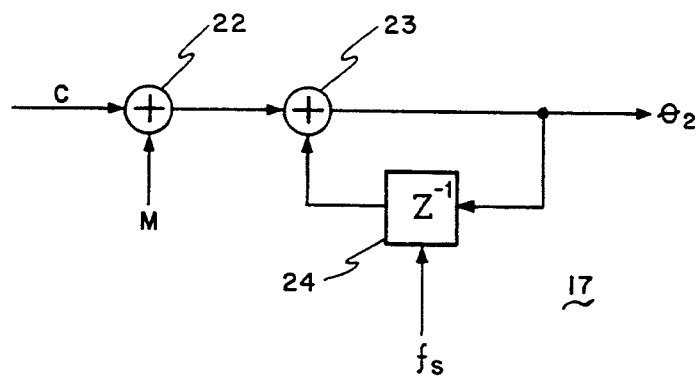
FIG. 3 is a block diagram of one example of the numerically controlled oscillator (NCO) shown in FIG. 1.

Now will be described the configuration and operation of the NCO 17 with reference to FIG. 3. The NCO 17 is provided with adders 22 and 23 and a one-sample delay circuit 24. All these adders 22 and 23 and one-sample delay circuit 24 are binary R-bit digital signal processing circuits.

The adder 23 and the one-sample delay circuit 24 constitute a digital integrating circuit, and the transfer function G(Z) of the loop involving the adder 23 and the one-sample delay circuit 24 can be represented by:

$$G(Z) = 1/(1 - Z^{-1}) \quad (2)$$

Meanwhile, a value M as well as a phase error signal C, which is the output of the LPF 16, is fed to the adder 2, which supplies (M+C) to the digital integrating circuit. Therefore, the overall transfer function H(Z) of the NCO 17 is:

$$H(Z) = (M + C)\{1/(1 - Z^{-1})^2\} = \sum_n (M + C) \cdot n Z^{-n} \quad (3)$$

Thus the NCO 17 serves as a sort of oscillator.

The oscillating cycle of the output from the NCO 17 is $2^R/(M+C)$ samples. Thus:

$$f2 = (M+C) fs/2^R \text{ (Hz)} \quad (4)$$

If the value of M above is set here to be the nominal value of f2, the phase of the NCO 17 will be controlled by the phase control signal C.

As is evident from the foregoing description, according to the present invention, a digital phase synchronizing loop which is formed by the multiplier 14, the adder 15, the LPF 16, the NCO 17 and the multiplier 18, performs nf1=mf2 in a synchronized state.

Thus the first preferred embodiment of the present invention can make up a rate conversion apparatus capable of quick pull-in without having to make the PLL operate at an extremely high frequency even if the values of m and n are great.

In the above described first embodiment, however, if either m or n, for instance n, is a multiple of $2^R$, the third phase signal $\theta 3$ will become always equal to and always zero. This means that, if either m or n is a multiple of $2^R$, the first embodiment will be unable to perform the desired frequency conversion. This problem is solved with a second preferred embodiment.

Before describing the second embodiment, its mathematical background will be explained. According to the theorem in the integer theory that "any integer can be represented by a sum of four or fewer prime numbers", m and n can be expressed in the following way.

$$n = n1 + n2 + n3 + n4$$

$$m = m1 + m2 + m3 + m4$$

where every one of numbers n1 through n4 and m1 through m4 is either a prime number or zero.

Here, $(n\theta 1 - m\theta 2)_{mod 2R}$ to be supplied to the LPF 16 is represented by the following equation.

$$(n\theta 1 - m\theta 2)_{mod 2R} = (n1\theta 1 - m1\theta 2)_{mod 2R} + \quad (5)$$
$$(n2\theta 1 - m2\theta 2)_{mod 2R} + (n3\theta 1 - m3\theta 2)_{mod 2R} +$$
$$(n4\theta 1 - m4\theta 2)_{mod 2R}$$

Since every one of the numbers n1 through n4 and m1 through m4 in Equation (5) is a prime number, in the modulo $2^R$ arithmetic operation, not all of the terms will uniformly give zero.

Therefore, if the circuit in FIG. 1 consisting of the multipliers 14 and 18, along with the subtractor 15, is replaced with a circuit in order to perform the operation represented by Equation (5), the desired frequency conversion can be achieved even if either m or n is a multiple of $2^R$.

Figure 4:
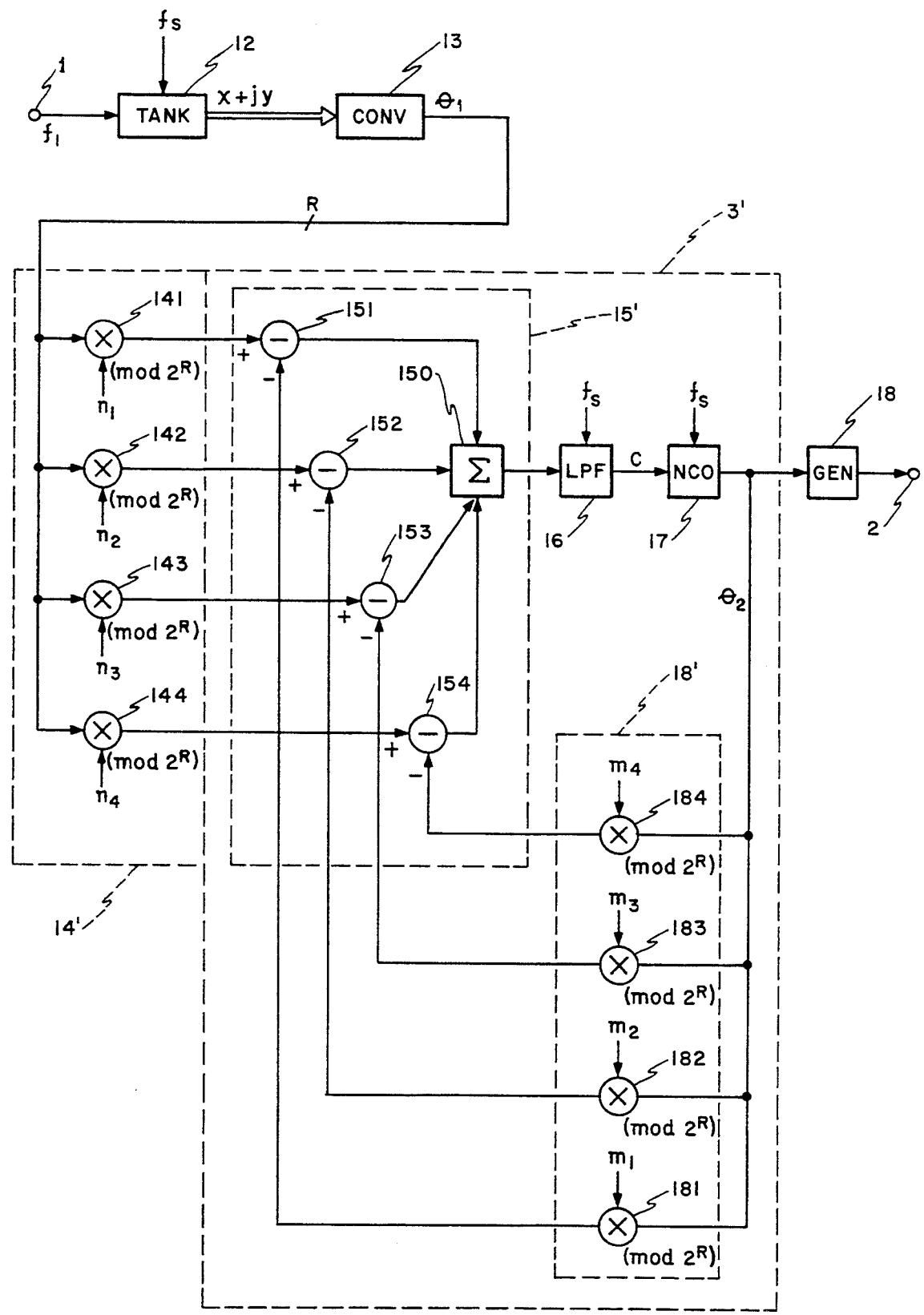
FIG. 4 is a block diagram illustrating a rate conversion apparatus, which is a second preferred embodiment of the invention.

FIG. 4 is a block diagram illustrating a second preferred embodiment of the present invention, which differs from the embodiment shown in FIG. 1 in the following three respects.

(1) The modulo $2^R$ multiplier 14 in FIG. 1 is replaced in FIG. 4 by a multiplier group 14', which consists of four multipliers 141, 142, 143 and 144 for performing operations to multiply the first phase signal $\theta 1$ by n1(mod $2^R$), n2(mod $2^R$), n3(mod $2^R$) and n4(mod $2^R$), respectively. Incidentally, there obviously is no need for a multiplier corresponding to ni (i=1, 2, 3, 4) to make the result of the operation zero.

(2) The multiplier 18 in FIG. 1 is replaced in FIG. 4 by a multiplier group 18', which consists of four multipliers 181, 182, 183 and 184 for performing operations to multiply the second phase signal $\theta 2$ by m1(mod $2^R$), m2(mod $2^R$), m3(mod $2^R$) and m4(mod $2^R$), respectively. Incidentally, as in the multiplier group 14', there obviously is no need for a multiplier corresponding to mi (i=1, 2, 3, 4) in order to make the result of the operation zero.

(3) The subtractor 15 in FIG. 1 is replaced by a circuit consisting of four subtractors 151 through 154 and a mod $2^R$ adder.

Next will be described the operation of the embodiment illustrated in FIG. 4. Description of the configurations and operations of other parts than the multiplier groups 14' and 18' and the circuit 18 will be dispensed with because they are identical with the corresponding parts in FIG. 1.

First, the multipliers 141 through 144 perform the operations of n1$\theta$1(mod $2^R$), n2$\theta$1(mod $2^R$), n3$\theta$1(mod $2^R$) and n4$\theta$1(mod $2^R$), respectively. The multipliers 181 through 184 perform the operations of m1$\theta$2(mod $2^R$), m2$\theta$2(mod $2^R$), m3$\theta$2(mod $2^R$) and m4$\theta$2(mod $2^R$), respectively. The subtractors 151 through 154 perform the operations of (n1$\theta$1−m1$\theta$2) (mod $2^R$), (n2$\theta$1−m2$\theta$2) (mod $2^R$), (n3$\theta$1−m3$\theta$2) (mod $2^R$), (n4$\theta$1−m4$\theta$2) (mod $2^R$), respectively. The results of these operations are added by the adder 150 to perform the operation of Equation (5).

Either the first or the second preferred embodiment of the present invention described above can constitute a rate conversion apparatus capable of quick pull-in without having to make the PLL operate at an extremely high frequency, even if the values of m and n are great.

As described above, both the first and the second embodiments require an operation clock frequency fs equal to about 32 times f1 or f2, whichever is the higher, because of the necessity to ensure a sufficiently high level of time accuracy for the output waveform of the clock generator 10. Therefore, if the values of f1 and f2 are extremely high, that of fs will be correspondingly high in order to make it difficult to realize the circuitry. A third preferred embodiment of the invention, to be described below with reference to FIG. 5, solves this problem.

The first and third embodiments differ from each other in that the third embodiment has a hybrid configuration while the first embodiment has a wholly digital configuration. The complex digital tank circuit 12 in FIG. 1 is replaced with a complex signal generating circuit 30. The digital PLL 2, too, is replaced with a PLL 2; which has a partly analog configuration.

Figure 5:
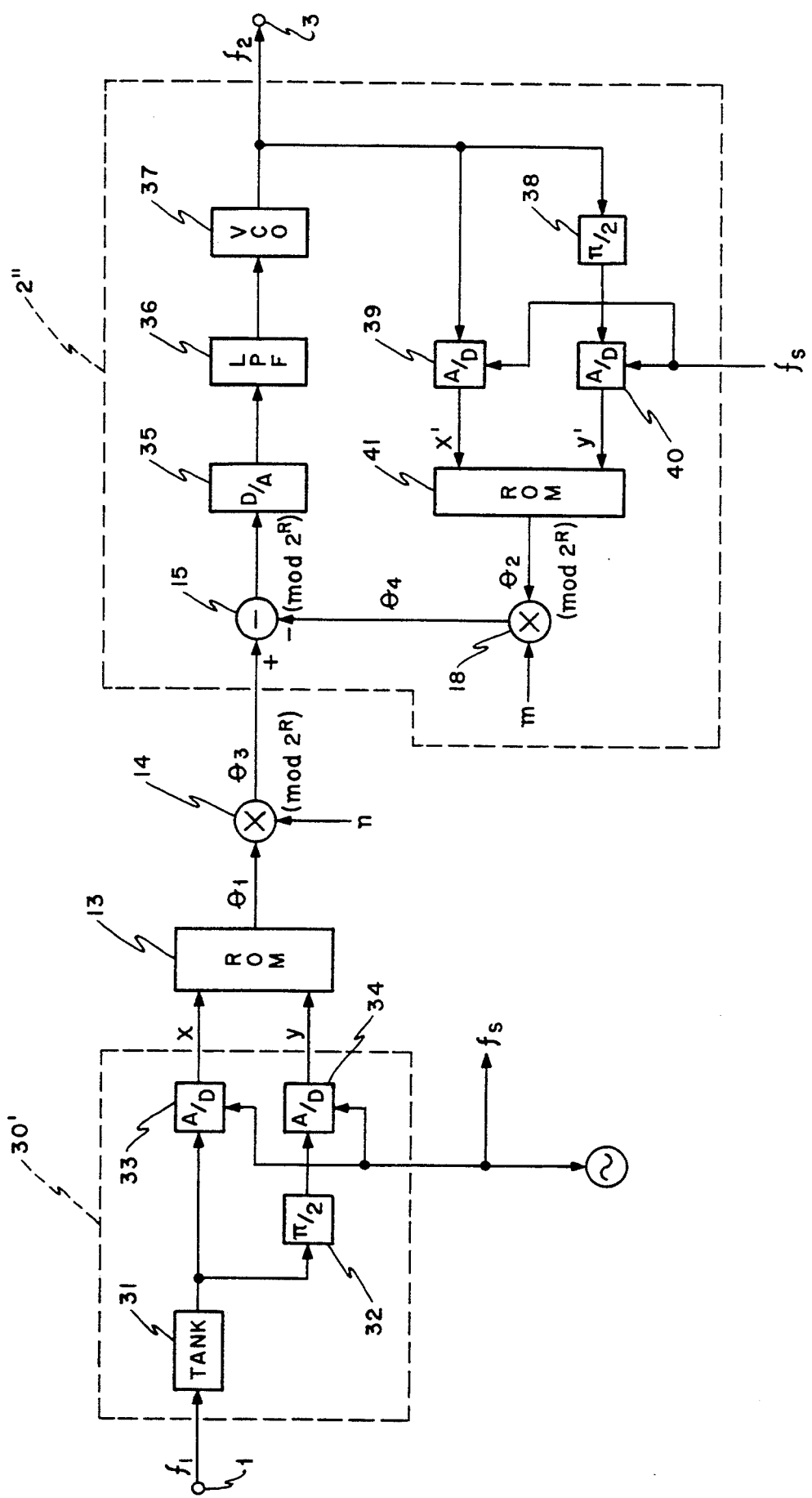
FIG. 5 is a block diagram illustrating a rate conversion apparatus, which is a third preferred embodiment of the invention.

Next will be described the third preferred embodiment with reference to FIG. 5, wherein a complex signal generating circuit 30 consists of an analog tank circuit 31, a phase shifter 32 and analog-to-digital (A/D) converters 33 and 34.

The analog tank circuit 31 is tuned to the frequency f1 of the input clock signal, and outputs a sine wave phase-synchronized with the input clock signal. Incidentally, if the input clock signal is entered from the input terminal 1 as a sine wave, this analog tank circuit 31 can be dispensed with. The sine wave of f1, in frequency outputted from the analog tank circuit 31, is supplied to the A/D converter 33. The output of the A/D converter 33 is a signal identical with the real part x of the complex signal x+jy referred to in FIG. 1. The output of the analog tank circuit 31 is also supplied to the phase shifter 32 to be shifted in phase by $\pi/2$. This $\pi/2$ phase-shifted signal is digitalized by the A/D converter 34, and constitutes the imaginary part 6 of the complex signal x+jy referred to in FIG. 1. These signals x and y are supplied to the ROM 13 to give the first phase signal $\theta 1$ as in the first preferred embodiment.

This first phase signal $\theta 1$ is multiplied by n (mod $2^R$) in the multiplier 14, to provide the third phase signal $\theta 3$. From this third phase signal $\theta 3$ is subtracted the fourth phase signal $\theta 4$, which is supplied by the multiplier 18 and by the subtractor 15, to produce the phase error signal, as in the first preferred embodiment.

In the third embodiment, this phase error signal is converted by a digital-to-analog (D/A) converter 35 into an analog signal and outputted as an analog phase error signal. The analog phase error signal is filtered by an LPF 36 and supplied to a VCO 37 to control the oscillating frequency and phase of the VCO 37, from which a second clock signal of f2 frequency is supplied.

This second clock signal is converted by A/D converters 39 and 40, along with a phase shifter 38, into a complex signal (x'+jy') having a phase angle which indicates the phase of the second clock signal. It is further converted by an ROM 41 into a second phase signal $\theta 2$. The operation of the circuit consisting of these A/D converters 39 and 40, phase shifter 38 and ROM 41 is the same as that of the circuit comprising the A/D converters 33 and 34, phase shifter 32 and ROM 13. If the output of the VCO 37 is a rectangular wave, there will be required an analog tank circuit tuned to the frequency f2 is coupled immediately between the coupling point between the input to the A/D converter 39 and that to the phase shifter 38.

The second phase signal $\theta 2$ is multiplied by m (mod $2^R$) by the multiplier 18 and supplied as a fourth phase signal to the subtractor 15. In this way, the clock signal of f1 in frequency is converted into another clock signal of f2 in frequency.

What is to be noted here is that in this third preferred embodiment the section consisting of the digital tank circuit 12 and the clock generator 10, which requires the highest time accuracy in the first embodiment, is replaced by an analog circuit. The sampling frequency for other parts will be high enough if it is not less than the Nyquist frequency, so that a lower operation clock frequency can be used than that of the first embodiment. In the aforementioned case of f1=1.544 MHz and f2=2.048 MHz for instance, fs can be set at 8 MHz.

As hitherto described, the present invention makes it possible to realize rate conversion of n/m in conversion ratio without having to set the operation frequency of the PLL extremely high or to reduce the equivalent bandwidth of the PLL even if the values of m and n are high. This results in the benefit of quicker pull-in. Also, the consequent freedom from the influence of the values of m and n enables the rate conversion apparatus, according to the invention to, be extensively applied to communications systems.

What is claimed is:

1. A rate conversion apparatus for converting a first periodical signal of frequency f1 (Hz) into a second periodical signal of frequency f2 (Hz) where f2=(n/m) f1, (where m and n are mutually prime integers), said apparatus comprising:
   clock pulse generating means for generating an operation clock signal having a frequency fs which is higher than the highest of said f1 or f2 frequencies;
   phase extracting means comprising a complex digital tank means, driven by said operation clock signal supplying a reference timing in the phase of said first periodical signal, for extracting the frequency f1 component from said first periodical signal in a complex form and converting the extracted component into a first R-bit binary signal indicating the phase of the first periodical signal;
   first multiplying means for generating a third R-bit phase signal by multiplying said first phase with said n (modulo 2);
   subtracting means for generating a phase error signal by subtracting a fourth phase signal from said third phase signal;
   digital filter means, driven by said operation clock signal supplying a reference timing of said phase error signal, for receiving said phase error signal and converting it into a smoothed phase error signal;
   periodic signal phase generating means, driven by said operation clock signal supplying a reference timing of said smoothed phase error signal, for generating a second R-bit phase signal of said second periodical signal, which is phase/frequency-controlled by said smoothed phase error signal;
   second multiplying means for generating said fourth phase signal by multiplying said second phase signal by said m (modulo 2; and
   clock generating means for generating said second periodical signal wherein said second phase signal provides control of frequency and phase.

2. A rate conversion apparatus, as claimed in claim 1, wherein said periodical signal phase generating means comprises a numerically controlled oscillator.

3. A rate conversion apparatus, as claimed in claim 1, wherein said complex digital tank means comprises:
   complex adder means for adding said first periodical signal and an output of a complex multiplying means;
   sample delay means, driven by said operation clock supplying a sample timing, for delaying said complex signal of said complex adder means by one sample; and
   said complex multiplying means multiplying the output of said delay means by a complex value $\alpha$ exp $(j\omega/fs)$ (where $\alpha$ is a constant value) and supplying the multiplied output to said complex adder means.

4. A rate conversion apparatus, as claimed in one of the claims 1 or 2, wherein:
   said m and n are represented as follows:

$$m=m1+m2+m3+m4, \ n=n1+n2+n3+n4$$

where every one of said m1, m2, m3, m4, n1, n2, n3, and n4 is either a prime number or zero;

said first multiplying means comprising first, second, third and fourth multipliers, each of said multipliers performing a modulo 2 multiplication of a commonly supplied said first phase signal, said n1, n2, n3 and n4, respectively;

said second multiplying means comprising fifth, sixth, seventh and eighth multipliers for performing a modulo 2 multiplication of a commonly supplied said second phase signal, said m1, m2, m3 and m4, respectively; and said subtracting means comprises a first subtractor for subtracting the output of said fifth multiplier from that of said first multiplier, a second subtractor for subtracting the output of said sixth multiplier from that of said second multiplier, a third subtractor for subtracting the output of said seventh multiplier from that of said third multiplier, a fourth subtractor for subtracting the output of said eight multiplier from that of said fourth multiplier, and an adder for modulo 2 adding the outputs of said first, second, third and fourth subtractors to generate said phase error signal.

5. A rate conversion apparatus, as claimed in claim 1, wherein said phase extracting means comprises:

single tuned filter means supplied with said first periodical signal and tuned to the frequency f1;

first phase shifting means for phase-shifting the output of said single tuned means by $\pi/2$;

first analog-to-digital (A/D) conversion means, driven by said operation clock signal, for A/D-converting the output of said single tuned means;

second analog-to-digital (A/D) conversion means, driven by said operation clock signal, for sampling the output of said single tuned means; and phase generating means, receiving outputs of said first and second A/D conversion means, for generating said first phase signal;

said periodical signal generating means comprising:

digital-to-analog (D/A) conversion means for D/A-converting said phase error signal to generate an analog phase error signal;

low-pass filter (LPF) means for filtering said analog phase error signal;

oscillator means, having an oscillating frequency and phase which are controlled by an output of said LPF means, for supplying said second periodical signal;

third A/D conversion means for A/D converting, driven by said operation clock signal, said second periodical signal;

second phase shifting means for phase-shifting said second periodical signal by $\pi/2$;

fourth A/D conversion means, driven by said operation clock signal, for A/D converting the output of said second phase shifting means; and means for supplying said second phase signal on a basis of an output of said third and fourth A/D conversion means as a complex signal.

6. A rate conversation apparatus, as claimed in claim 1, wherein:

said m and n is represented as follows:

$$m = m1 + m2 + m3 + m4, \quad n = n1 + n2 + n3 + n4$$

where every one of said m1, m2, m3, m4, n1, n2, n3 and n4 is either a prime number of zero;

said first multiplying means comprising first, second, third and fourth multipliers, each of said multipliers performing a modulo 2 multiplication of commonly supplied said first phase signal, n1, n2, n3 and n4, respectively;

said second multiplying means comprising fifth, sixth, seventh and eighth multipliers for performing a modulo 2 multiplication of commonly supplied said second phase signal, said m1, m2, m3 and m4, respectively; and said subtracting means comprises a first subtractor for subtracting the output of said fifth multiplier from that of said first multiplier, a second subtractor for subtracting the output of said sixth multiplier from that of said second multiplier, a third subtractor for subtracting the output of said seventh multiplier from that of said third multiplier, a fourth subtractor for subtracting the output of said eighth multiplier from that of said fourth multiplier, and an adder for modulo 2 adding the outputs of said first, second, third and fourth subtractors to generate said phase error signal.

7. A system for converting a first clock signal of frequency f1 into a second clock signal of frequency f2, said frequency $f2 = (n/m) f1$, where m and n are prime integers, said system comprising a digital tank circuit wherein adder means is coupled through a converter means to a first means for multiplying and coupled through a one sample delay circuit and a multiplier to said adder, the first clock signal f1 being applied to said first means for multiplying via said tank circuit, for converting said first clock signal of frequency f1 into an R-bit first phase signal ($\theta$1) indicating the phase of said first clock signal, said first multiplying means for multiplying said first phase signal $\theta$1 by n (modulo 2) in order to provide a third phase signal ($\theta$3); phase locked-loop means comprising a cascade of a subtractor, a low-pass filter, a controlled oscillator, and a feedback loop extending from said controlled oscillator through a second multiplying means for multiplying to said subtractor, said second multiplying means multiplying a second phase signal ($\theta$2) by m (modulo 2) in order to fix a phase of said second clock signal which is an output of the controlled oscillator and in order to generate a fourth phase signal ($\theta$4), an output of said subtractor being a signal representing a phase error between the third ($\theta$3) and fourth ($\theta$4) phase signals which is filtered by said low-pass filter in order to control an oscillating phase of the controlled oscillator.

8. The system of claim 7 comprising clock generating means for generating the second clock signal wherein the second phase signal ($\theta$2) provides control of frequency and phase.

9. The system of claim 7 wherein said phase locked loop is a digital locked loop, and said controlled oscillator is a numerically controlled oscillator.

10. The system of claim 9 wherein said first means for multiplying comprises a first four parallel multipliers, each of said four parallel multipliers having an output coupled to an individually associated one of four subtractors, a summing circuit coupled to outputs of said four subtractor circuits, and said second means for multiplying comprises a second four parallel multipliers, each of said second four parallel multipliers having an output coupled to an individually associated one of said four subtractors.

11. The system of claim 10 wherein the integers are $m = m1 + m2 + m3 + m4$; and $n = n1 + n2 + n3 + n4$, the integers n1 to n4 being applied to individually associated ones of said first four parallel multipliers, and the integers m1 to m4 being applied to individually associated ones of said second four parallel multipliers.

12. The system of claim 7 further comprising an analog tank circuit having an input of and tuned to frequency f1 and having a sine wave output phase synchronized with frequency f1, and analog to digital converter means for supplying a digital signal representing frequency f1 to said first means for multiplying.

13. The system of either claim 7 or claim 12 wherein said controlled oscillator is a voltage controlled oscillator, digital-to-analog converter means coupled between said subtractor and said low-pass filter, and other analog-to-digital converter means in said feedback loop and coupled between said controlled oscillator and said second multiplier.

14. The system of either claim 7 or claim 12 wherein said controlled oscillator is a voltage controlled oscillator, digital-to-analog converter means coupled between said subtractor and said low-pass filter, wherein each of said analog-to-digital converters comprises two analog-to-digital converted connected in parallel, one of said parallel analog-to-digital converters having a phase shift of $\pi/2$.

* * * * *